(12) United States Patent
Cho et al.

(10) Patent No.: US 10,121,990 B2
(45) Date of Patent: Nov. 6, 2018

(54) ORGANIC LIGHT EMITTING DEVICES AND METHODS OF FABRICATING THE SAME

(71) Applicant: Electronics and Telecommunications Research Institute, Daejeon (KR)

(72) Inventors: Doo-Hee Cho, Daejeon (KR); Jonghee Lee, Daejeon (KR); Hyunsu Cho, Daejeon (KR); Byoung-Hwa Kwon, Daejeon (KR); Jaehyun Moon, Daejeon (KR); Young Sam Park, Daejeon (KR); Jin Wook Shin, Daejeon (KR); Byoung Gon Yu, Chungcheongbuk-do (KR); Hyunkoo Lee, Daejeon (KR); Jong Tae Lim, Seoul (KR); Nam Sung Cho, Daejeon (KR); Jun-Han Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 12 days.

(21) Appl. No.: 15/417,624

(22) Filed: Jan. 27, 2017

(65) Prior Publication Data

US 2017/0317312 A1    Nov. 2, 2017

(30) Foreign Application Priority Data

Apr. 28, 2016  (KR) .................. 10-2016-0052133
Sep. 22, 2016  (KR) .................. 10-2016-0121574

(51) Int. Cl.
*H01L 51/52*  (2006.01)
*H01L 51/00*  (2006.01)

(52) U.S. Cl.
CPC ...... *H01L 51/5253* (2013.01); *H01L 51/0097* (2013.01); *H01L 2251/5338* (2013.01)

(58) Field of Classification Search
None
See application file for complete search history.

(56) References Cited

U.S. PATENT DOCUMENTS 6,515,428 B1 * 2/2003 Yeh .................. H01L 27/322
                                                  313/489
9,177,821 B2   11/2015 Jung et al.
(Continued)

FOREIGN PATENT DOCUMENTS

KR  10-2007-0106669 A  11/2007
KR  10-2010-0042223 A   4/2010
(Continued)

*Primary Examiner* — Eva Y Montalvo
*Assistant Examiner* — Kevin Quinto
(74) *Attorney, Agent, or Firm* — Rabin & Berdo, P.C.

(57) ABSTRACT

Disclosed are an organic light emitting device and a method of fabricating the same. The method of fabricating an organic light emitting device comprises forming a flexible substrate, and forming an organic light emitting layer on the flexible substrate. The forming the flexible substrate comprises forming a first polymer pattern on a first metal layer, forming a second metal layer on an exposed portion of the first metal layer through the first polymer pattern, forming a gas barrier layer on the first polymer pattern and the second metal layer, forming a second polymer layer on the gas barrier layer, and removing the first metal layer to expose a surface of the first polymer pattern and a surface of the second metal layer.

20 Claims, 7 Drawing Sheets

(56) References Cited

U.S. PATENT DOCUMENTS

| | | |
|---|---|---|
| 9,445,504 B2 | 9/2016 | Kang et al. |
| 9,510,457 B2 | 11/2016 | Kang et al. |
| 2011/0073901 A1* | 3/2011 | Fujita .................. C09D 165/00 257/100 |
| 2016/0002407 A1* | 1/2016 | Wakita ................. C08G 73/106 257/40 |

FOREIGN PATENT DOCUMENTS

| | | |
|---|---|---|
| KR | 10-1161301 B1 | 7/2012 |
| KR | 10-1191865 B1 | 10/2012 |
| KR | 10-1271838 B1 | 6/2013 |

\* cited by examiner

ORGANIC LIGHT EMITTING DEVICES AND METHODS OF FABRICATING THE SAME

CROSS-REFERENCE TO RELATED APPLICATIONS

This U.S. nonprovisional patent application claims priority under 35 U.S.C § 119 of Korean Patent Application 10-2016-0052133 filed on Apr. 28, 2016, and 10-2016-0121574 filed on Sep. 22, 2016 the entire contents of which are hereby incorporated by reference.

BACKGROUND

The present inventive concept relates to an organic light emitting device and a method of fabricating the same, and more particularly, to an organic light emitting device and a method of fabricating the same including a flexible substrate having a metal line.

An organic light emitting device (OLED) is a self-emissive device that emits light by electrically exciting an organic light emitting material. An organic light emitting diode may emit various colors in accordance with the kind of a material constituting an organic light emitting layer. The organic light emitting device have superior display characteristics such as wide viewing angle, fast response time, small thickness, low manufacturing cost, and high contrast. The organic light emitting device is in the limelight as a next generation flat panel display device.

SUMMARY

Embodiments of the present inventive concept provide a method of fabricating an organic light emitting device having improved reliability.

Embodiments of the present inventive concept provide an organic light emitting device having improved reliability.

An object of the present inventive concept is not limited to the above-mentioned one, other objects which have not been mentioned above will be clearly understood to those skilled in the art from the following description.

According to exemplary embodiments of the present inventive concept, a method of fabricating an organic light emitting device may comprise: forming a flexible substrate; and forming an organic light emitting layer on the flexible substrate. The step of forming the flexible substrate may comprise: forming a first polymer pattern on a first metal layer; forming a second metal layer on a portion of the first metal layer, the portion of the first metal layer being exposed through the first polymer pattern; forming a gas barrier layer on the first polymer pattern and the second metal layer; forming a second polymer layer on the gas barrier layer; and removing the first metal layer to expose a surface of the first polymer pattern and a surface of the second metal layer.

In some embodiments, the first metal layer may comprise a material different from that of the second metal layer.

In some embodiments, the gas barrier layer may comprise silicon oxide ($SiO_2$), silicon nitride (SiNx), silicon oxynitride ($SiO_xN_y$), titanium oxide (TiO2), zirconium oxide ($ZrO_2$), or aluminum oxide ($Al_2O_3$).

In some embodiments, the gas barrier layer may comprise polyacryl, polyurethane, epoxypolymer, polyimide, polypropylene, fluorine-containing polymer, or silicone polymer.

In some embodiments, the gas barrier layer may comprise one or more inorganic layers or one or more organic layers.

In some embodiments, the second metal layer may be formed using an electroplating or an electroless plating.

In some embodiments, the organic light emitting layer may be formed on the surface of the first polymer pattern and the surface of the second metal layer.

In some embodiments, the step of forming the flexible substrate may further comprise, before forming the second metal layer, coating a catalyst on a surface of the first metal layer.

In some embodiments, the catalyst may comprise palladium (Pd).

In some embodiments, the step of forming the flexible substrate may further comprise, before forming the second metal layer, performing a surface treatment process on the surface of the first polymer pattern to cause the surface of the first polymer pattern to have hydrophobic characteristics.

In some embodiments, the surface treatment process may comprise forming on the surface of the first polymer pattern a fluorinated organic layer, a silicone organic layer, or a self-assemble monolayer.

According to exemplary embodiments of the present inventive concept, an organic light emitting device may comprise: a flexible substrate; and an organic light emitting layer on the flexible substrate. The flexible substrate may comprise: a polymer layer; a gas barrier layer on the polymer layer; polymer patterns on the gas barrier layer; and a metal line on a portion of the gas barrier layer. The portion of the gas barrier layer may be exposed through the polymer patterns.

In some embodiments, the metal line may comprise first segments parallel extending in a first direction and second segments parallel extending in a second direction crossing the first direction. The first segments and the second segments may be cross to each other.

In some embodiments, the polymer patterns may be disposed spaced apart in the first direction and the second direction. The first segments may be interposed between the polymer patterns that are adjacent to each other in the second direction. The second segments may be interposed between the polymer patterns that are adjacent to each other in the first direction. The organic light emitting device may further comprise a side barrier that is disposed on an edge of the gas barrier layer and surrounds the metal line. The side barrier may be physically connected to ends of the first segments and ends of the second segments.

In some embodiments, the polymer patterns may be disposed in the polymer layer. The gas barrier layer may extend between the polymer layer and the metal line and between the polymer layer and the side barrier. The gas barrier layer may be disposed between the polymer layer and the polymer patterns.

In some embodiments, the polymer patterns may comprise central patterns and an edge pattern. The central patterns may fill spaces enclosed by the first segments and the second segments. The edge pattern may surround the metal line.

In some embodiments, the polymer patterns may have a thickness the same as that of the metal line.

In some embodiments, the polymer patterns may have a thickness greater than that of the metal line.

In some embodiments, the gas barrier layer may comprise polyacryl, polyurethane, epoxypolymer, polyimide, polypropylene, fluorine-containing polymer, or silicone polymer.

In some embodiments, the gas barrier layer may comprise one or more inorganic layers or one or more organic layers.

DETAILED DESCRIPTION OF EMBODIMENTS

Figure 1A:
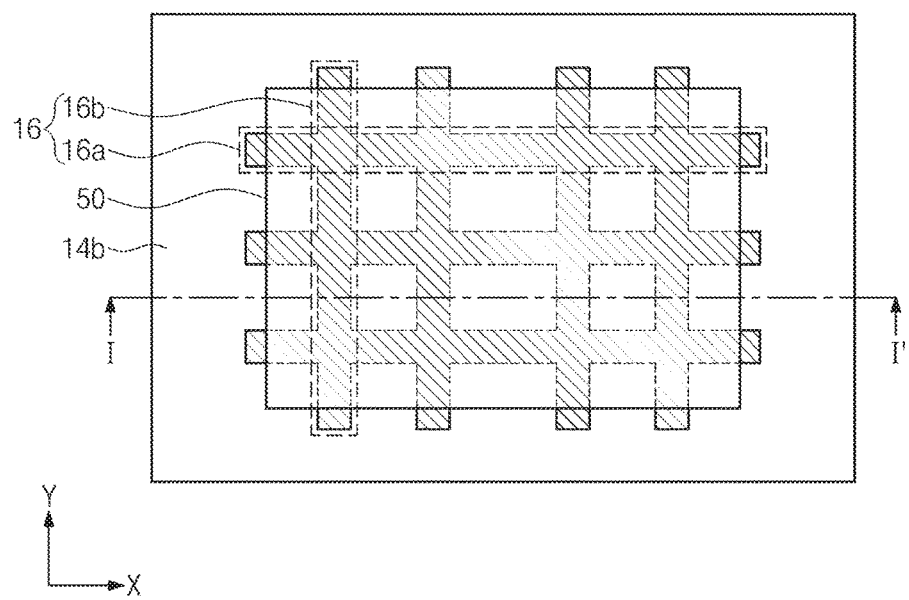
FIG. 1A is a plan view illustrating an organic light emitting device including a flexible substrate having a metal line according to exemplary embodiments of the present inventive concept.

The advantages and features of the present invention and methods of achieving them will be apparent from the following exemplary embodiments that will be described below in more detail with reference to the accompanying drawings showing the exemplary embodiments. It should be noted, however, that the present invention is not limited to the following exemplary embodiments, and may be implemented in various forms. Rather, the exemplary embodiments are provided only to disclose the present invention and let those skilled in the art fully know the scope of the present invention. The present invention is defined only by the scope of the claims and equivalents thereof. Like reference numerals refer to like elements throughout the specification.

In the following description, terminologies are used only for explaining particular embodiments while not limiting the present invention. The terms of a singular form include plural forms unless otherwise stated. The meaning of "comprises", "includes", "comprising", and/or "including" specifies an element, a step, a process, and/or a device but does not exclude other elements, steps, processes, and/or devices.

In addition, the embodiments in the detailed description will be discussed with reference to sectional and/or plan views as ideal exemplary views of the present invention. In the drawings, thicknesses of layers and regions are exaggerated for effectively explaining the technical contents. Accordingly, shapes of the exemplary views may be modified according to manufacturing techniques and/or allowable errors. Therefore, the embodiments of the present invention are not limited to the specific shape illustrated in the exemplary view. For example, an etching region illustrated in right angle may be a round or curvature shape. Areas illustrated in the drawings are schematic in nature, and their shapes are intended to exemplarily disclose actual shapes of a region of a device and are not intended to limit the scope of the present invention.

Figure 1B:
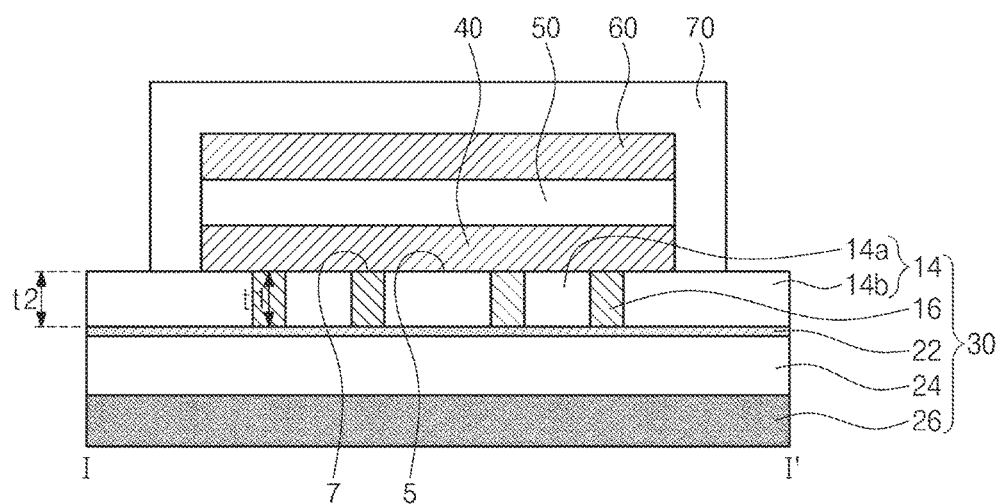
FIG. 1B is a cross-sectional view taken along line I-I' of FIG. 1A illustrating an organic light emitting device including a flexible substrate having a metal line according to exemplary embodiments of the present inventive concept.

FIG. 1A is a plan view illustrating an organic light emitting device including a flexible substrate having a metal line according to exemplary embodiments of the present inventive concept. FIG. 1B is a cross-sectional view taken along line I-I' of FIG. 1A illustrating an organic light emitting device including a flexible substrate having a metal line according to exemplary embodiments of the present inventive concept.

Referring to FIGS. 1A and 1B, an organic light emitting device 100 may include a flexible substrate 30, a first electrode 40, an organic light emitting layer 50, a second electrode 60, and an encapsulation layer 70. The flexible substrate 30 may include first polymer patterns 14, a metal line 16, a gas barrier layer 22, a second polymer layer 24, and a protection film 26.

The second polymer layer 24 may be disposed on the protection film 26. The protection film 26 may include a cured polymer layer. The second polymer layer 24 may include a flexible material. For example, the second polymer layer 24 may include a thermosetting polymer or a photo-curable polymer. For example, the second polymer layer 24 may include acrylate resin, urethane resin, polyethylene resin, polypropylene resin, polystyrene resin, polyvinylchloride resin, polyimide resin, polyester resin, silicone resin, or a resin mixture including at least two thereof. For example, the second polymer layer 24 may include a resin that includes ceramic particles. The ceramic particle may have a size ranging from about 200 nm to about 1 μm. The ceramic particle may have a hollow shape having an empty space therein.

The gas barrier layer 22 may be disposed on the second polymer layer 24. The gas barrier layer 22 may have a thickness small enough to have flexibility. For example, the gas barrier layer 22 may include a dense crystalline or amorphous material. For example, the gas barrier layer 22 may include a single inorganic thin layer of silicon oxide ($SiO_2$), silicon nitride ($SiN_x$), silicon oxynitride ($SiO_xN_y$), titanium oxide ($TiO_2$), zirconium oxide ($ZrO_2$), or aluminum oxide ($Al_2O_3$). Alternatively, the gas barrier layer 22 may include a single organic thin layer of polyacryl, polyurethane, epoxypolymer, polyimide, polypropylene, fluorine-containing polymer, or silicone polymer. Dissimilarly, the gas barrier layer 22 may include a multiple thin layer consisting of one or more inorganic thin layers and/or one or more organic thin layers.

The metal line 16 may be disposed on the gas barrier layer 22. The metal line 16 may include first segments 16a and second segments 16b. The first segments 16a may parallel extend in a first direction X, and the second segments 16b may parallel extend in a second direction Y. The first and second segments 16a and 16b may be cross to each other. The metal line 16 may include, for example, copper, nickel, gold, silver, or platinum.

The first polymer patterns 14 may be disposed on portions of the gas barrier layer 22 that are exposed through the metal line 16. The first polymer patterns 14 may include central patterns 14a and an edge pattern 14b. The central patterns 14a may fill spaces enclosed by the first and second segments 16a and 16b of the metal line 16. The edge pattern 14b may be disposed on an edge of the gas barrier layer 22, and may surround the metal line 16. The edge pattern 14b may be spaced apart from the central patterns 14a. For example, the first polymer patterns 14 may have a thickness t2 the same as a thickness t1 of the metal line 16. Alternatively, the first polymer patterns 14 may have a thickness t2 greater than a thickness t1 of the metal line 16. The first polymer patterns 14 may include a flexible material. For example, the first polymer patterns 14 may include a thermosetting polymer or a photo-curable polymer. For example, the first polymer patterns 14 may include acrylate resin, urethane resin, polyethylene resin, polypropylene resin, polystyrene resin, polyvinylchloride resin, polyimide resin, polyester resin, fluorinated organic resin, silicone resin, or a resin mixture including at least two thereof. For example, the first polymer patterns 14 may include a resin that includes ceramic particles. The ceramic particle may have a size ranging from about 200 nm to about 1 μm. The ceramic particle may have a hollow shape having an empty space therein.

The first electrode 40 may be disposed on surfaces 5 of the first polymer patterns 14 and a surface 7 of the metal line 16. The first electrode 40 may vertically overlap the first and second segments 16a and 16b of the metal line 16. The first electrode 40 may include a conductive material. For example, the first electrode 40 may include a transparent conductive material such as indium tin oxide (ITO), a metal fiber such as a silver nanowire, a carbon fiber, a grapheme composite, a conductive polymer material, or the like.

The organic light emitting layer 50 may be disposed on the first electrode 40. The organic light emitting layer 50 may include an organic light emitting material, and may serve as an organic light emitting layer. The organic light emitting layer 50 may further include a dopant provided in the organic light emitting material. Alternatively, the organic light emitting layer 50 may include a semiconductor material, and may serve as a light absorption layer.

According to exemplary embodiments of the present inventive concept, the second polymer layer 24 may have a molecular structure that is sized enough to allow water ($H_2O$) molecule to pass therethrough, so that water and/or oxygen may permeate through the second polymer layer 24 but may be blocked by the gas barrier layer 22 disposed between the organic light emitting layer 50 and the second polymer layer 24, thereby preventing water and/or oxygen from entering into the organic light emitting layer 50. As the organic light emitting layer 50 is prevented from damage caused by water and/or oxygen, it may be possible to improve reliability of the organic light emitting device 100.

The second electrode 60 may be disposed on the organic light emitting layer 50. The second electrode 60 may include a conductive material such as, for example, metal or transparent conductive oxide. One of the first and second electrodes 40 and 60 may be a cathode, and the other of the first and second electrodes 40 and 60 may be an anode. The second electrode 60 may be provided thereon with the encapsulation layer 70 that surrounds the first electrode 40, the organic light emitting layer 50, and the second electrode 60. The encapsulation layer 70 may protect the organic light emitting layer 50 from environmental water and oxygen.

Figure 2A:
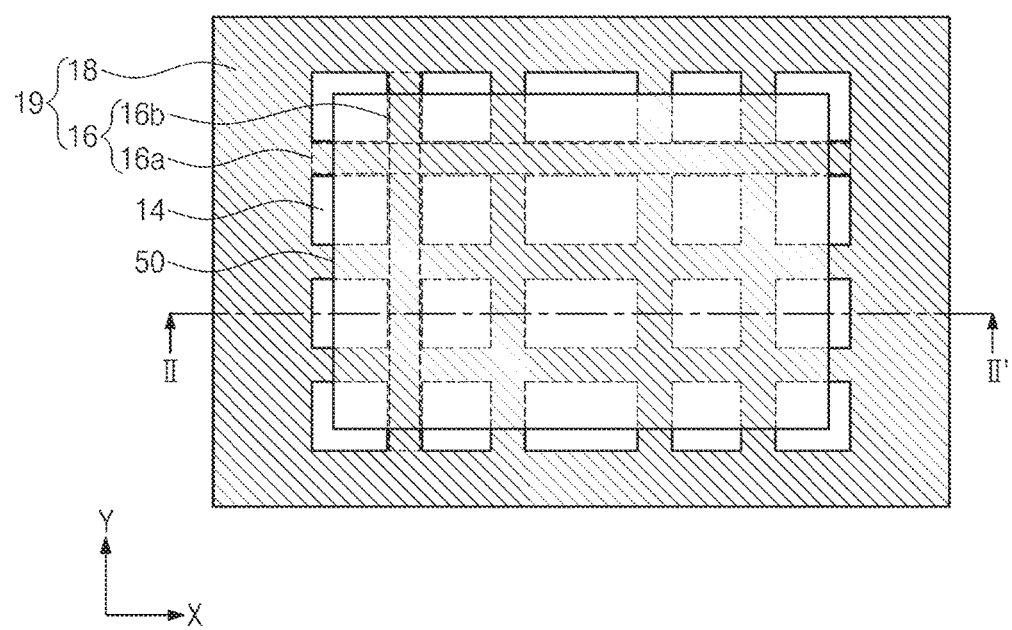
FIG. 2A is a plan view illustrating an organic light emitting device including a flexible substrate having a metal line according to exemplary embodiments of the present inventive concept.
Figure 2B:
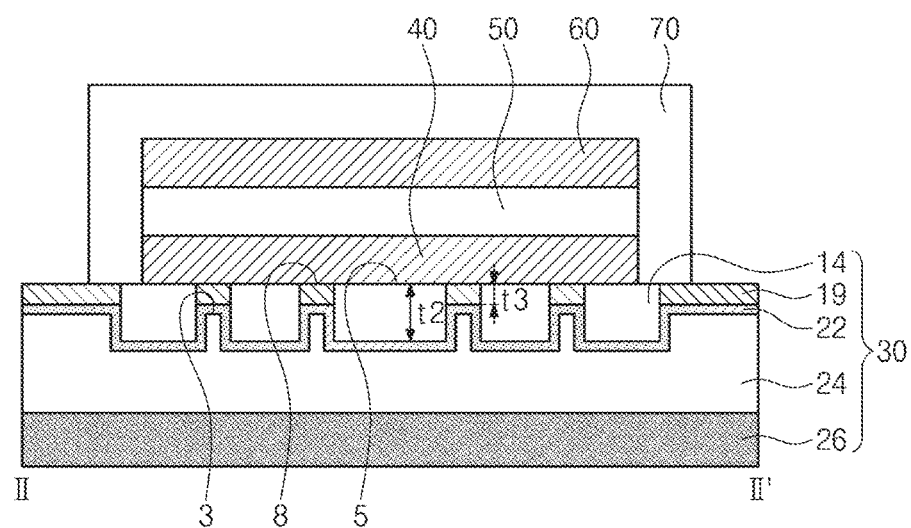
FIG. 2B is a cross-sectional view taken along line II-II' of FIG. 2A illustrating an organic light emitting device including a flexible substrate having a metal line according to exemplary embodiments of the present inventive concept.

FIG. 2A is a plan view illustrating an organic light emitting device including a flexible substrate having a metal line according to exemplary embodiments of the present inventive concept. FIG. 2B is a cross-sectional view taken along line II-II' of FIG. 2A illustrating an organic light emitting device including a flexible substrate having a metal line according to exemplary embodiments of the present inventive concept. For brevity of the description, components substantially the same as those of the embodiment illustrated in FIGS. 1A to 1B are allocated the same reference numerals thereto, and a detailed description thereof may be omitted.

Referring to FIGS. 2A and 2B, an organic light emitting device 200 may include a flexible substrate 30, a first electrode 40, an organic light emitting layer 50, a second electrode 60, and an encapsulation layer 70.

The flexible substrate 30 may include first polymer patterns 14, a metal layer 19, a gas barrier layer 22, a second polymer layer 24, and a protection film 26.

The second polymer layer 24 may be disposed on the protection film 26. The first polymer patterns 14 may be disposed in the second polymer layer 24. The first polymer patterns 14 may be disposed spaced apart from each other in first and second directions X and Y crossing each other. The second polymer layer 24 may have portions that are exposed through the first polymer patterns 14, and the first polymer patterns 14 may have surfaces 5 positioned higher than surfaces 3 of the exposed portions of the second polymer layer 24.

The metal layer 19 may be disposed on the surfaces 3 of the portions of the second polymer layer 24 that are exposed through the first polymer patterns 14. For example, the metal layer 19 may have a thickness t3 less than thicknesses t2 of the first polymer patterns 14. Alternatively, the metal layer 19 may have a thickness t3 the same as thicknesses t2 of the first polymer patterns 14. The metal layer 19 may have a surface 9 coplanar with the surfaces 5 of the first polymer patterns 14. The metal layer 19 may include, for example, copper, nickel, gold, silver, or platinum.

The metal layer 19 may include a metal line 16 and a side barrier 18. The metal line 16 may be disposed on a portion of the second polymer layer 24 between the first polymer patterns 14. The metal line 16 may include first segments 16a and second segments 16b. The first segments 16a may extend in the first direction X while being disposed between the first polymer patterns 14 that adjacently face each other in the second direction Y. The second segments 16b may extend in the second direction Y while being disposed between the first polymer patterns 14 that adjacently face each other in the first direction X. The first and second segments 16a and 16b may be cross to each other.

The side barrier 18 may be disposed on an edge of the second polymer layer 24, and may surround the metal line 16 and outermost ones of the first polymer patterns 14. For example, the side barrier 18 may have a ring shape. The side barrier 18 may be physically connected to ends of the first segments 16a and ends of the second segments 16b of the metal line 16. The side barrier 18 may prevent oxygen and water from permeating toward sidewalls of the second polymer layer 24.

Between the first polymer patterns 14 and the second polymer layer 24, the gas barrier layer 22 may extend between the metal line 16 and the second polymer layer 24 and between the side barrier 18 and the second polymer layer 24. The side barrier 18 may be disposed on an edge of the gas barrier layer 22, and may extend along the edge of the gas barrier layer 22.

The first electrode 40, the organic light emitting layer 50, and the second electrode 60 may be sequentially disposed on the surface 8 of the metal layer 19 and the surfaces 5 of the first polymer patterns 14. The second electrode 60 may be provided thereon with the encapsulation layer 70 that surrounds the first electrode 40, the organic light emitting layer 50, and the second electrode 60.

FIGS. 3 to 8 are cross-sectional views taken along line I-I' of FIG. 1A illustrating a method of fabricating an organic light emitting device including a flexible substrate having a metal line according to exemplary embodiments of the present inventive concept.

Figure 3:
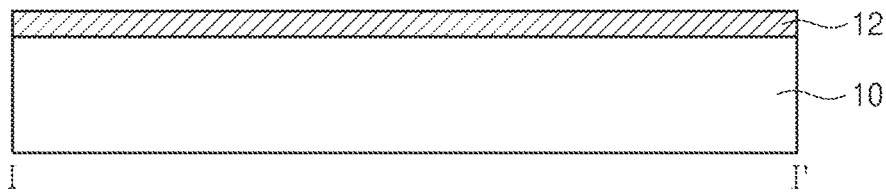
FIGS. 3 to 8 are cross-sectional views taken along line I-I' of FIG. 1A illustrating a method of fabricating an organic light emitting device including a flexible substrate having a metal line according to exemplary embodiments of the present inventive concept.

Referring to FIG. 3, a first metal layer 12 may be formed on a sacrificial substrate 10. The sacrificial substrate 10 may include a glass substrate, a quartz substrate, a plastic substrate, a silicon substrate, or metal substrate. The first metal layer 12 may be formed using a sputtering deposition, thermal deposition, an electron beam deposition, or a plating method. The first metal layer 12 may include metal, graphene, or conductive oxide. The metal may include, for example, copper, chromium, nickel, titanium, molybdenum, tungsten, manganese, silver, gold, platinum, tin, silicon, or an alloy including at least two thereof. The conductive oxide may include, for example, ITO (indium tin oxide), IZO (indium zinc oxide), Al-doped zinc oxide, tin oxide, F-doped tin oxide, Sb-doped tin oxide, or ZTO (zinc tin oxide).

A surface treatment process may be performed on a surface of the first metal layer 12. The surface treatment process may be carried out to easily remove the first metal layer 12 from a second metal layer 16 and first polymer patterns 14 in a subsequent process for removing the first metal layer 12. The surface treatment process may cause the surface of the first metal layer 12 to have hydrophobic characteristics. For example, the surface treatment process may include a plasma treatment process, a fluorinated organic coating process, a silicone organic coating process, or a self-assemble monolayer coating process. For example, the plasma treatment process may be, for example, an oxygen plasma treatment process, an argon plasma treatment process, a nitrogen plasma treatment process, or a fluorinated carbon treatment process. The fluorinated organic coating process may be a process for forming, for example, fluoroethyl acrylate, fluoroethyl methacrylate, fluoropropyl acrylate, fluoropropyl methacrylate, fluorobutyl acrylate, fluorobutyl methacrylate, fluoropentyl acrylate, or fluoropentyl methacrylate. The silicone organic coating process may be a process for forming, for example, hexamethyldisilazane (HMDS).

In some cases, a catalyst may be coated on the first metal layer 12. The catalyst may be used as a reducing agent in a subsequent process for forming a second metal layer 16 on the first metal layer 12. The catalyst may include, for example, palladium (Pd).

Figure 4:
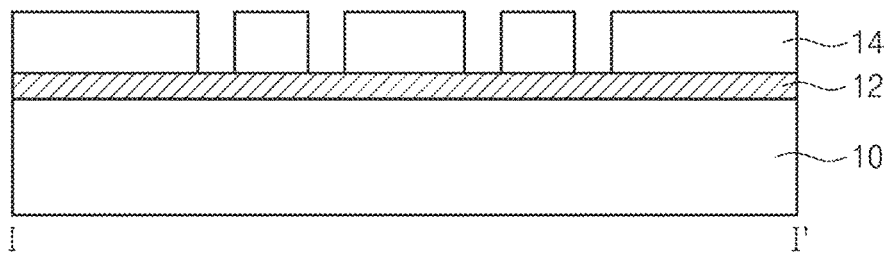

Referring to FIG. 4, first polymer patterns 14 may be formed on the first metal layer 12. The first polymer patterns 14 may partially expose a top surface of the first metal layer 12. The first polymer patterns 14 may be formed by printing and curing a liquid polymer layer. The first polymer patterns 14 may be formed using, for example, a screen printing, a gravure printing, an offset printing, or an inkjet printing. Alternatively, the first polymer patterns 14 may be formed by forming a liquid polymer layer and stripping portions of the polymer layer that are exposed to ultraviolet rays through a mask pattern. For example, the first polymer patterns 14 may include a thermosetting polymer or a photo-curable polymer. For example, the first polymer patterns 14 may include acrylate resin, urethane resin, polyethylene resin, polypropylene resin, polystyrene resin, polyvinylchloride resin, polyimide resin, polyester resin, fluorinated organic resin, silicone resin, or a resin mixture including at least two thereof. For example, the first polymer patterns 14 may include a resin that includes ceramic particles. The ceramic particle may have a size ranging from about 200 nm to about 1 µm. The ceramic particle may have a hollow shape having an empty space therein.

A surface treatment process may additionally be performed on surfaces of the first polymer patterns 14. The surface treatment process may be performed lest a second metal layer 16 should be formed on the first polymer patterns 14 in a subsequent process. The surface treatment process may include coating a fluorinated organic material, a silicone organic material, or a self-assemble monolayer on the surfaces of the first polymer patterns 14. The fluorinated organic material may be, for example, fluoroethyl acrylate, fluoroethyl methacrylate, fluoropropyl acrylate, fluoropropyl methacrylate, fluorobutyl acrylate, fluorobutyl methacrylate, fluoropentyl acrylate, or fluoropentyl methacrylate. The silicone organic material may be, for example, hexamethyldisilazane (HMDS). In this step, as the first polymer patterns 14 have hydrophobic characteristics and the first metal layer 12 has hydrophilic characteristics, the surfaces of the first polymer patterns 14 may be selectively coated with the fluorinated organic material, the silicone organic material, or the self-assemble monolayer that have hydrophobic characteristics.

Figure 5:
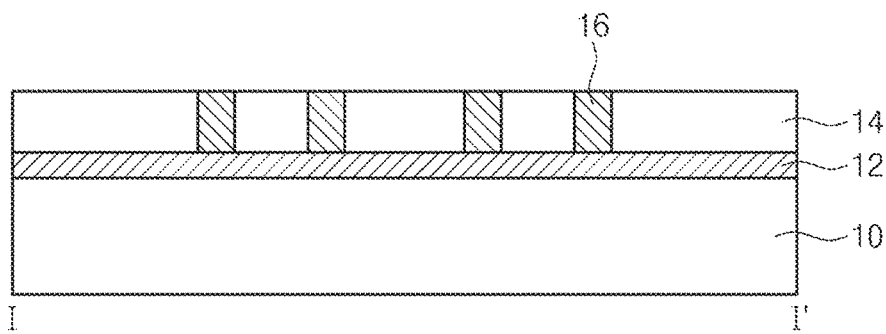

Referring to FIG. 5, the first metal layer 12 may be provided with a metal line 16 (referred to hereinafter as a second metal layer) on its top surface that is partially exposed through the first polymer patterns 14. The second metal layer 16 may fill a space between the first polymer patterns 14. For example, the second metal layer 16 may be formed to have a thickness the same as those of the first polymer patterns 14. Alternatively, the second metal layer 16 may be formed to have a thickness less than those of the first polymer patterns 14. The second metal layer 16 may be formed using an electroless plating or an electroplating. The electroless plating may be a process where metal is plated via a chemical reaction. In the case of the electroless plating, the catalyst formerly formed on the first metal layer 12 may reduce metal ions, which are included in an electrolyte used for the electroless plating, to form the second metal layer 16 on the exposed surface of the first metal layer 12. In order to easily remove the first metal layer 12 from the second metal layer 16 in a subsequent process for removing the first metal layer 12, the second metal layer 16 may be formed of a metal material different from that of the first metal layer 12. The second metal layer 16 may include, for example, copper, nickel, gold, silver, or platinum.

Figure 6:
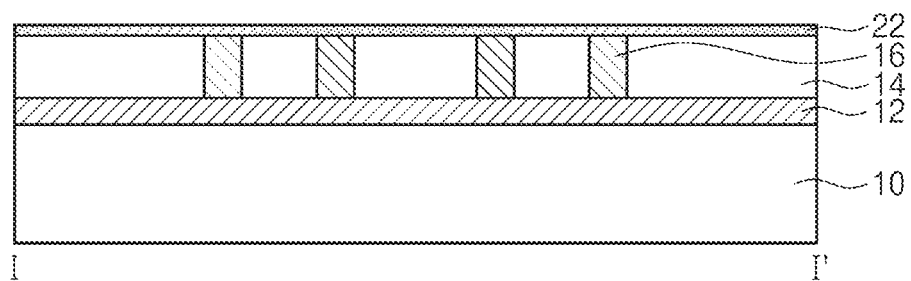

Referring to FIG. 6, a gas barrier layer 22 may be formed on the first polymer patterns 14 and the second metal layer 16. For example, the gas barrier layer 22 may include a single inorganic thin layer of silicon oxide ($SiO_2$), silicon nitride (SiNx), silicon oxynitride (SiOxNy), titanium oxide ($TiO_2$), zirconium oxide ($ZrO_2$), or aluminum oxide ($Al_2O_3$). Alternatively, the gas barrier layer 22 may include a single organic thin layer of polyacryl, polyurethane, epoxypolymer, polyimide, polypropylene, fluorine-containing polymer, or silicone polymer. Dissimilarly, the gas barrier layer 22 may include a multiple thin layer consisting of one or more inorganic thin layers and/or one or more organic thin layers. The gas barrier layer 22 may have a thickness small enough to have flexibility.

According to exemplary embodiments of the present inventive concept, in order to prevent water and/or oxygen from permeating into a device through the second polymer layer (see 24 of FIG. 5) having a molecular structure that is sized enough to allow water ($H_2O$) molecule to pass therethrough, the gas barrier layer 22 may be formed before the second polymer layer 24 is formed. As the gas barrier layer 22 blocks water and/or oxygen that has permeated through the second polymer layer 24, it may be possible to prevent water and/or oxygen from entering into an organic light emitting layer (see 50 of FIG. 1B) formed on surfaces (see 5 and 7 of FIG. 8) of the first polymer patterns 14 and the second metal layer 16.

Figure 7:
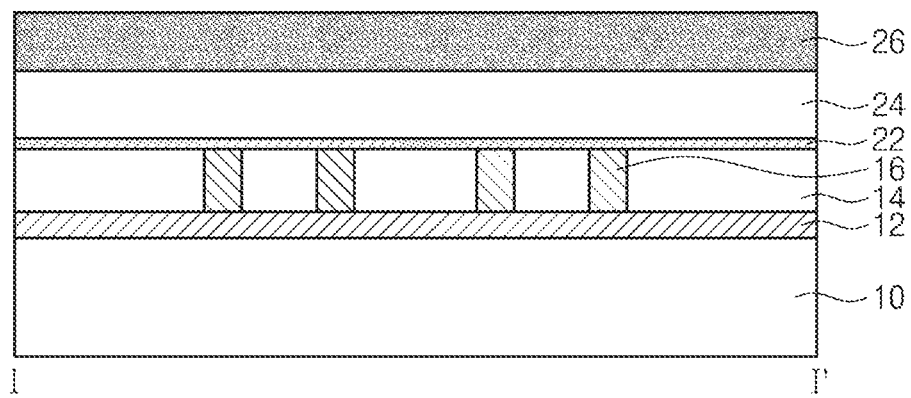

Referring to FIG. 7, a second polymer layer 24 may be formed on the gas barrier layer 22. The second polymer layer 24 may be formed by forming and curing a liquid polymer layer on the gas barrier layer 22. The second polymer layer 24 may be formed using, for example, a screen printing, a slot die coating, a spin coating, a bar coating, a doctor blade coating, or a spray coating. For example, the second polymer layer 24 may include a thermosetting polymer or a photo-curable polymer. For example, the second polymer layer 24 may include acrylate resin, urethane resin, polyethylene resin, polypropylene resin, polystyrene resin, polyvinylchloride resin, polyimide resin, polyester resin, silicone resin, or a resin mixture including at least two thereof. For example, the second polymer layer 24 may include a resin that includes ceramic particles. The ceramic particle may have a size ranging from about 200 nm to about 1 μm. The ceramic particle may have a hollow shape having an empty space therein.

In order to increase adhesive force between the gas barrier layer 22 and the second polymer layer 24, a plasma process may be performed on a surface of the gas barrier layer 22 before the second polymer layer 24 is formed. The plasma process may be, for example, an oxygen plasma process. A protection film 26 may further be formed on the second polymer layer 24. The protection film 26 may include a cured polymer layer. The protection film 26 may serve as a protection layer for preventing the second polymer layer 24 from tearing down caused by external force in a subsequent process for removing the first metal layer 12 or for fabricating an organic light emitting device.

Figure 8:
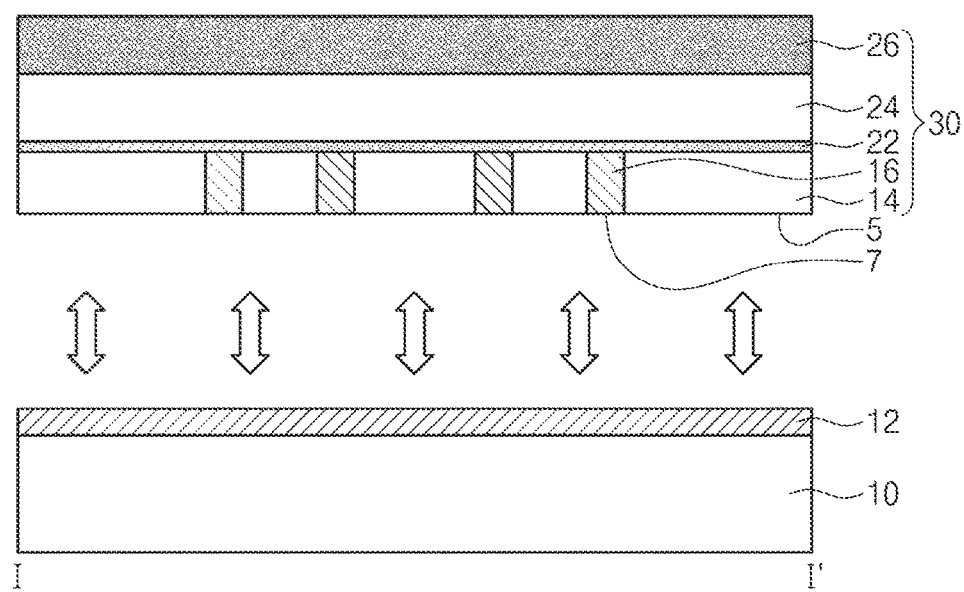

Referring to FIG. 8, the first metal layer 12 may be removed from the first polymer patterns 14 and the second metal layer 16. Surfaces 5 of the first polymer patterns 14 and a surface 7 of the second metal layer 16 may be revealed when removing the first metal layer 12 that in contact with the surfaces 5 and 7. The removal of the first metal layer 12 may include applying external force to detach the first metal layer 12 together with the sacrificial substrate 10 from the first polymer patterns 14 and the second metal layer 16. As the first metal layer 12 is removed, a flexible substrate 30 may be formed to include the second metal layer 16 and the gas barrier layer 22. In detail, the flexible substrate 30 may include the protection film 26, the second polymer layer 24, the gas barrier layer 22, the second metal layer 16, and the first polymer patterns 14.

According to exemplary embodiments of the present inventive concept, as a printing or plating process is used to form the flexible substrate including the metal layer and the gas barrier layer, a flexible organic light emitting device may be fabricated at low cost.

Referring back to FIGS. 1A and 1B, the flexible substrate 30 may be provided thereon with a first electrode 40, an organic light emitting layer 50, and a second electrode 60 that are sequentially formed.

The first electrode 40 may be disposed on the surfaces 5 of the first polymer patterns 14 and the surface 7 of the second metal layer 16. The first electrode 40 may include a conductive material. For example, the first electrode 40 may include a transparent conductive material such as indium tin oxide (ITO), a metal fiber such as a silver nanowire, a carbon fiber, a grapheme composite, or a conductive polymer material.

The organic light emitting layer 50 may be disposed on the first electrode 40. The organic light emitting layer 50 may include an organic light emitting material, and may serve as an organic light emitting layer. The organic light emitting layer 50 may further include a dopant provided in the organic light emitting material. Alternatively, the organic light emitting layer 50 may include a semiconductor material, and may serve as a light absorption layer.

The second electrode 60 may be disposed on the organic light emitting layer 50. The second electrode 60 may include a conductive material such as, for example, metal or transparent conductive oxide. One of the first and second electrodes 40 and 60 may be a cathode, and the other of the first and second electrodes 40 and 60 may be an anode. An encapsulation layer 70 may be formed on the second electrode 60. The encapsulation layer 70 may cover a top surface and opposite sidewalls of the second electrode 60, sidewalls of the organic light emitting layer 50, and opposite sidewalls of the first electrode 40.

Figure 9:
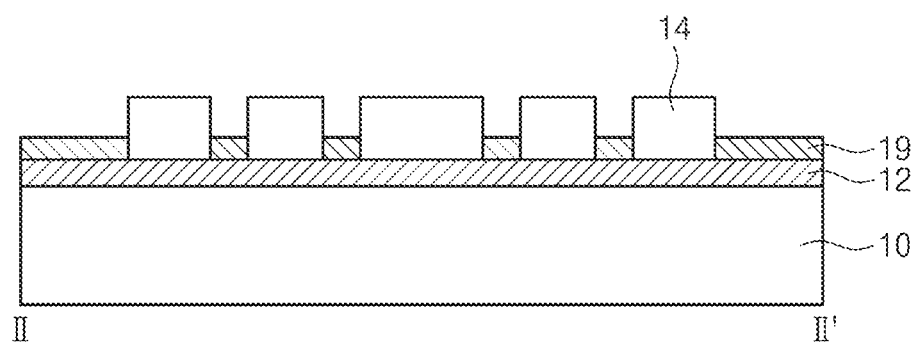
FIGS. 9 to 11 are cross-sectional views taken along line II-II' of FIG. 2A illustrating a method of fabricating an organic light emitting device including a flexible substrate having a metal line according to exemplary embodiments of the present inventive concept.
Figure 10:
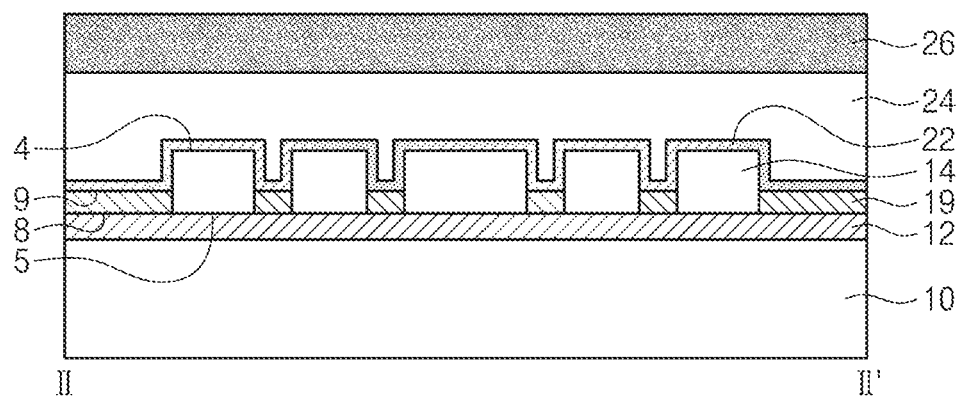
Figure 11:
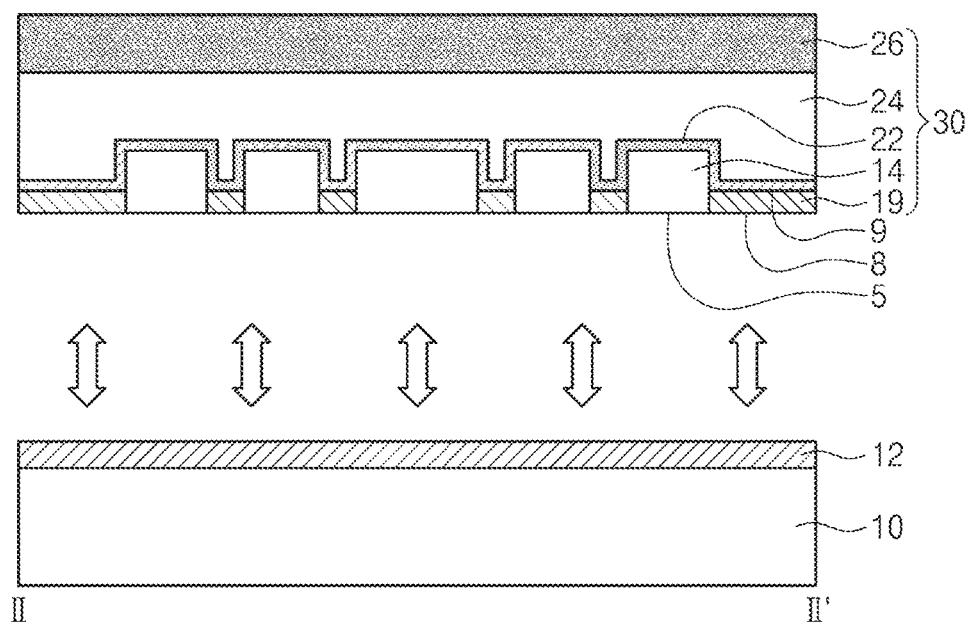

FIGS. 9 to 11 are cross-sectional views taken along line II-II' of FIG. 2A illustrating a method of fabricating an organic light emitting device including a flexible substrate having a metal line according to exemplary embodiments of the present inventive concept. For brevity of the description, those components substantially the same as those of the present exemplary embodiments are allocated the same reference numerals thereto, and detailed explanation thereof will be omitted.

Referring to FIG. 9, a first metal layer 12 may be formed on a sacrificial substrate 10. First polymer patterns 14 may be formed on the first metal layer 12. The first metal layer 12 may be provided thereon with the first polymer patterns 14 that are disposed spaced apart from each other first and second directions X and Y crossing each other. A metal layer 19 may be disposed on portions of the first metal layer 12 that are exposed through the first polymer patterns 14. For example, the metal layer 19 may be formed to have a thickness less than those of the first polymer patterns 14. Alternatively, the metal layer 19 may be formed to have a thickness the same as those of the first polymer patterns 14. The metal layer 19 may be formed using an electroless plating or an electroplating. In order to easily remove the first metal layer 12 from the metal layer 19 in a subsequent process for removing the first metal layer 12, the metal layer 19 may be formed of a metal material different from that of the first metal layer 12. The metal layer 19 may include, for example, copper, nickel, gold, silver, or platinum.

Referring to FIG. 10, a gas barrier layer 22 may be formed to conformally cover an opposing surface 9 opposite to a surface 8 of the metal layer 19, exposed both sidewalls of the first polymer patterns 14 through the metal layer 19, and opposing surfaces 4 opposite to surfaces 5 of the first polymer patterns 14. A second polymer layer 24 may be formed on the gas barrier layer 22. The second polymer layer 24 may cover a surface of the gas barrier layer 22, and may be formed on gas barrier layer 22 while filling a space between the first polymer patterns 14. A protection film 26 may be formed on the second polymer layer 24.

Referring to FIG. 11, the first metal layer 12 may be removed from the first polymer patterns 14 and the metal layer 19. The surfaces 5 of the first polymer patterns 14 and the surface 8 of the metal layer 19 may be revealed when removing the first metal layer 12 that is in contact with the surfaces 5 and 8. The removal of the first metal layer 12 may include applying external force to detach the first metal layer 12 together with the sacrificial substrate 10 from the first polymer patterns 14 and the metal layer 19. As the first metal layer 12 is removed, a flexible substrate 30 may be formed to include the protection film 26, the second polymer layer 24, the gas barrier layer 22, the metal layer 19, and the first polymer patterns 14.

Referring back to FIGS. 2A and 2B, a first electrode 40, an organic light emitting layer 50, a second electrode 60, and an encapsulation layer 70 may be sequentially formed on the surfaces 5 of the first polymer patterns 14 and the surface 8 of the metal layer 19.

According to exemplary embodiments of the present inventive concept, the gas barrier layer may be formed on the first polymer patterns and the metal line formed therebetween, and the second polymer layer may be formed on the gas barrier layer. As the gas barrier layer blocks water and oxygen that has permeated through the second polymer layer, the water and oxygen may be prevented from entering into the organic light emitting layer formed on the surfaces of the first polymer patterns and the surface of the metal line.

According to exemplary embodiments of the present inventive concept, a printing or plating process may be used to form the flexible substrate including the metal line and the gas barrier layer without high cost process such as photolithography. It thus may be possible to fabricate a flexible organic light emitting device at low cost.

Although the present inventive concept has been described in connection with the embodiments of the present inventive concept illustrated in the accompanying drawings, it will be understood to those skilled in the art that various changes and modifications may be made without departing from the technical spirit and essential feature of the present inventive concept. It thus should be understood that the above-described embodiments are not limiting but illustrative in all aspects.

What is claimed is:

1. A method of fabricating an organic light emitting device, the method comprising:
    forming a flexible substrate; and
    forming an organic light emitting layer on the flexible substrate,
    wherein forming the flexible substrate comprises:
        forming a first polymer pattern on a first metal layer;
        forming a second metal layer on a portion of the first metal layer, the portion of the first metal layer being exposed through the first polymer pattern;
        forming a gas barrier layer on the first polymer pattern and the second metal layer;
        forming a second polymer layer on the gas barrier layer; and
        removing the first metal layer to expose a surface of the first polymer pattern and a surface of the second metal layer.

2. The method of claim 1, wherein the first metal layer comprises a material different from that of the second metal layer.

3. The method of claim 1, wherein the gas barrier layer comprises silicon oxide ($SiO_2$), silicon nitride (SiNx), silicon oxynitride (SiOxNy), titanium oxide ($TiO_2$), zirconium oxide ($ZrO_2$), or aluminum oxide ($Al_2O_3$).

4. The method of claim 1, wherein the gas barrier layer comprises one or more inorganic layers or one or more organic layers.

5. The method of claim 1, wherein the second metal layer is formed using an electroplating or an electroless plating.

6. The method of claim 1, wherein the organic light emitting layer is formed on the surface of the first polymer pattern and the surface of the second metal layer.

7. The method of claim 1, wherein forming the flexible substrate further comprises, before forming the second metal layer, coating a catalyst on a surface of the first metal layer.

8. The method of claim 1, wherein forming the flexible substrate further comprises, before forming the second metal layer, performing a surface treatment process on the surface of the first polymer pattern to cause the surface of the first polymer pattern to have hydrophobic characteristics.

9. The method of claim 8, wherein the surface treatment process comprises forming on the surface of the first polymer pattern a fluorinated organic layer, a silicone organic layer, or a self-assemble monolayer.

10. An organic light emitting device, comprising:
    a flexible substrate;
    a first electrode on the flexible substrate; and
    an organic light emitting layer on the first electrode,
    wherein the flexible substrate comprises:
        a polymer layer;
        a gas barrier layer on the polymer layer;
        polymer patterns on the gas barrier layer; and
        a metal line on a portion of the gas barrier layer, the portion of the gas barrier layer being exposed through the polymer patterns,
    wherein the polymer patterns have a lower surface in contact with the gas barrier layer and an upper surface in contact with the first electrode.

11. The device of claim 10, wherein the polymer patterns have a thickness the same as that of the metal line.

12. The device of claim 10, wherein the polymer patterns have a thickness greater than that of the metal line.

13. The device of claim 10, wherein the gas barrier layer comprises polyacryl, polyurethane, epoxypolymer, polyimide, polypropylene, fluorine-containing polymer, or silicone polymer.

14. The device of claim 10, wherein the gas barrier layer comprises one or more inorganic layers or one or more organic layers.

15. The device of claim 10, wherein the metal line has a lower surface in contact with the gas barrier layer and an upper surface in contact with the first electrode.

16. The device of claim 10, wherein the metal line has a lower surface in contact with the gas barrier layer and an upper surface opposite to the lower surface, and the upper surface of the metal line is flush with the upper surface of the polymer patterns.

17. The device of claim 10, wherein the metal line comprises first segments parallel extending in a first direction and second segments parallel extending in a second direction crossing the first direction, the first segments and the second segments being cross to each other.

18. The device of claim 17, wherein
    the polymer patterns are disposed spaced apart in the first direction and the second direction,
    the first segments are interposed between the polymer patterns that are adjacent to each other in the second direction,
    the second segments are interposed between the polymer patterns that are adjacent to each other in the first direction,
    the organic light emitting device further comprises a side barrier that is disposed on an edge of the gas barrier layer and surrounds the metal line, the side barrier being physically connected to ends of the first segments and ends of the second segments.

19. The device of claim 18, wherein
    the polymer patterns are disposed in the polymer layer,
    the gas barrier layer extends between the polymer layer and the metal line and between the polymer layer and the side barrier, the gas barrier layer being disposed between the polymer layer and the polymer patterns.

20. An organic light emitting device, comprising:
    a flexible substrate; and
    an organic light emitting layer on the flexible substrate,
    wherein the flexible substrate comprises:
        a polymer layer;
        a gas barrier layer on the polymer layer;
        polymer patterns on the gas barrier layer; and
        a metal line on a portion of the gas barrier layer, the portion of the gas barrier layer being exposed through the polymer patterns, wherein the metal line comprises first segments parallel extending in a first direction and second segments parallel extending in a second direction crossing the first direction, the first segments and the second segments being cross to each other, wherein the polymer patterns comprise central patterns and an edge pattern, wherein the central patterns fill spaces enclosed by the first segments and the second segments, and the edge pattern surrounds the metal line.

* * * * *